United States Patent
Moitzi et al.

(10) Patent No.: US 12,165,940 B2
(45) Date of Patent: Dec. 10, 2024

(54) COMPONENT CARRIER WITH SURFACE-CONTACTABLE COMPONENT EMBEDDED IN LAMINATED STACK

(71) Applicant: AT&S Austria Technologie & Systemtechnik Aktiengesellschaft, Leoben (AT)

(72) Inventors: Heinz Moitzi, Zeltweg (AT); Johannes Stahr, Gassing (AT); Andreas Zluc, Leoben (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 15/929,600

(22) Filed: May 12, 2020

(65) Prior Publication Data
US 2020/0365477 A1  Nov. 19, 2020

(30) Foreign Application Priority Data
May 15, 2019 (EP) .................................... 19174726

(51) Int. Cl.
*H01L 23/31* (2006.01)
*H01L 23/00* (2006.01)
(Continued)

(52) U.S. Cl.
CPC ............ *H01L 23/31* (2013.01); *H01L 23/585* (2013.01); *H01L 24/19* (2013.01); *H01L 29/06* (2013.01)

(58) Field of Classification Search
CPC ....... H01L 23/31; H01L 23/585; H01L 24/19; H01L 29/06
See application file for complete search history.

(56) References Cited

U.S. PATENT DOCUMENTS 9,048,222 B2 *  6/2015  Hung .................... H01L 23/528
9,653,428 B1   5/2017  Hiner et al.
(Continued)

FOREIGN PATENT DOCUMENTS

CN   1406455 A   3/2003
CN   1835229 A   9/2006
(Continued)

OTHER PUBLICATIONS

Manook, R.; Partial European Search Report in Application No. 19174726.0; pp. 1-21; Nov. 28, 2019; European Patent Office; 80298, Munich, Germany.
(Continued)

*Primary Examiner* — Timor Karimy
(74) *Attorney, Agent, or Firm* — Robert A. Blaha; Smith Tempel Blaha LLC

(57) ABSTRACT

A component carrier which includes a laminated stack having at least one electrically insulating layer structure and/or at least one electrically conductive layer structure, and a component having at least one electrically conductive connection structure and embedded in the stack, wherein the at least one electrically conductive connection structure of the component is exposed with respect to the stack so that a free exposed end of the at least one electrically conductive connection structure of the component is flush with or extends beyond an exterior main surface of the stack.

8 Claims, 5 Drawing Sheets

(51) Int. Cl.
*H01L 23/58* (2006.01)
*H01L 29/06* (2006.01)

(56) References Cited

U.S. PATENT DOCUMENTS

| | | |
|---|---|---|
| 2003/0015342 A1 | 1/2003 | Sakamoto et al. |
| 2006/0226527 A1* | 10/2006 | Hatano ............... H01L 23/5389 438/109 |
| 2009/0293271 A1 | 12/2009 | Tanaka |
| 2012/0205789 A1 | 8/2012 | Natsuaki et al. |
| 2012/0309130 A1* | 12/2012 | Hin ..................... H01L 21/6836 438/113 |
| 2015/0034374 A1* | 2/2015 | Shimizu .................. H01L 24/20 174/257 |
| 2015/0069621 A1 | 3/2015 | Weatherspoon et al. |
| 2016/0316566 A1 | 10/2016 | Sakai et al. |
| 2016/0322238 A1* | 11/2016 | Chen ....................... H01L 24/97 |
| 2016/0322288 A1 | 11/2016 | Lin |
| 2017/0077053 A1* | 3/2017 | Keser .................... H01L 24/46 |
| 2018/0068978 A1* | 3/2018 | Jeng ....................... H01L 24/02 |
| 2018/0068983 A1 | 3/2018 | Chang et al. |
| 2018/0286824 A1 | 10/2018 | Jeng et al. |
| 2019/0341368 A1* | 11/2019 | Hu .......................... H01L 24/08 |

FOREIGN PATENT DOCUMENTS

| | | |
|---|---|---|
| CN | 107195607 A | 9/2017 |
| CN | 108463527 A | 8/2018 |
| EP | 3478033 A1 | 5/2019 |
| WO | 2018182753 A1 | 10/2018 |

OTHER PUBLICATIONS

Manook, R.; European Search Report in Application No. 19174726.0; pp. 1-28; Feb. 28, 2020; European Patent Office; 80298, Munich, Germany.

Office Action in Application No. 202010408672.1; pp. 1-9; Sep. 26, 2023; China National Intellectual Property Administration, No. 6, Xitucheng Lu, Jimenqiao Haidian District, Beijing City, 100088, China.

Gong X.; Second Office Action in Application No. 202010408672.1; pp. 1-10; May 13, 2024; China National Intellectual Property Administration; No. 6 Xitucheng Road, ☐Haidian District, Beijing, P.R. China 100088.

English Translation of Second Office Action in Application No. 202010408672.1; pp. 1-19; May 13, 2024; China National Intellectual Property Administration; No. 6 Xitucheng Road, ☐Haidian District, Beijing, P.R. China 100088.

* cited by examiner

COMPONENT CARRIER WITH SURFACE-CONTACTABLE COMPONENT EMBEDDED IN LAMINATED STACK

CROSS-REFERENCE TO RELATED APPLICATIONS

This application claims the benefit of the filing date of the European Patent Application No. 19 174 726.0, filed May 15, 2019, the disclosure of which is hereby incorporated herein by reference.

TECHNICAL FIELD

Embodiments of the invention relate to a method of manufacturing a component carrier, to a component carrier, and to a system.

BACKGROUND

In the context of growing product functionalities of component carriers equipped with one or more electronic components and increasing miniaturization of such components as well as a rising number of components to be mounted on or embedded in the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

In particular, efficiently embedding a component in a component carrier is an issue.

SUMMARY

There may be a need to efficiently embed a component in a component carrier.

According to an exemplary embodiment of the invention, a component carrier is provided, wherein the component carrier comprises a laminated stack (i.e., a multilayer structure with layer structures being interconnected by lamination, rather than being formed by molding) comprising at least one electrically insulating layer structure and/or at least one electrically conductive layer structure, and a component (in particular a semiconductor chip) having at least one electrically conductive connection structure and embedded in the stack, wherein the at least one electrically conductive connection structure of the component is exposed with respect to the stack so that a free exposed end of the at least one electrically conductive connection structure of the component flushes with (i.e. is aligned with) or extends (or protrudes) beyond an exterior main surface (in particular a planar main surface) of the stack.

According to another exemplary embodiment of the invention, a system is provided which comprises a component carrier having the above mentioned features, and at least one further component (which may be embedded in a module or which may be alternatively surface-mounted individually on the component carrier) vertically stacked with the component carrier and electrically coupled with the embedded component by the at least one electrically conductive connection structure.

According to still another exemplary embodiment of the invention, a method of manufacturing a component carrier is provided, wherein the method comprises providing a laminated stack or laminating a stack, the stack comprising at least one electrically conductive layer structure and/or at least one electrically insulating layer structure, embedding a component having at least one electrically conductive connection structure in the stack, and exposing a free end of the at least one electrically conductive connection structure with respect to the stack so that the free exposed end flushes with (is flush with) or extends beyond an exterior main surface of the stack.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "laminated stack" may particularly denote a flat or planar structure or laminate formed by bonding together two or more thin sheets or layer structures arranged on top of each other. Such layer structures may be arranged and/or formed parallel to one another and may be connected to one another by the application of temperature and/or mechanical pressure.

In the context of the present application, the term "semiconductor chip" may particularly denote a component comprising a semiconductor material, in particular as a primary or basic material. The semiconductor material may for instance be a type IV semiconductor such as silicon or germanium, or may be a type III-V semiconductor material such as gallium arsenide. In particular, the semiconductor chip may be a naked die or a molded die.

According to an exemplary embodiment of the invention, a component carrier is provided in which an electrically conductive connection structure belonging to an embedded component (in particular a semiconductor chip) extends up to an exterior main surface of the entire component carrier, for instance by being aligned with a planar exterior surface of the stack or even protruding outwardly beyond such a planar exterior surface of the stack. By exposing a free end of such an electrically conductive connection structure with regard to an electronic periphery, it may be possible to embed a component in a component carrier in a highly compact way while at the same time allowing for a short path or even direct electric contacting of the embedded component in a vertical direction via the exposed one or more electrically conductive connection structures. Consequently, the length of an electric path from the embedded component to a periphery of the component carrier can be made very short so that also losses of transported electric signals can be kept very small. Connecting the electrically conductive connection structure to the component carrier already prior to its embedding in the stack and constituting them as a part of the component also renders the manufacturing process simple and straightforward. By embedding the component in a laminated stack, a compact vertical geometry may be obtained while at the same time allowing surface mounting and/or embedding of one or more further components on the large horizontal mounting area of a laminate-type component carrier (such as a printed circuit board, PCB). Also, a vertical coupling of such a laminate-type component carrier with a further module may be possible, to thereby create even sophisticated systems in a simple way.

According to an exemplary embodiment of the invention, one or more connection structures (such as copper pillars) may be used for z-axis connection. Such a connection structure may be applied to the component (in particular a semiconductor chip) with high registration accuracy to connect to the component. Such a connection architecture may also allow obtaining a high aspect ratio. For instance, the one or more embedded components may comprise a memory, a processor, a memory-processor compound, may accomplish a connection to power modules, may comprise at least one antenna, etc. Coppering in z-axis direction of the component carrier may be realized in a highly efficient way by exemplary embodiments of the invention. Advantageously, the connection structure (in particular a copper pillar, or a pillar made from another material, wherein the pillar can be shaped in different geometries according to the needs of a specific application) can be raised beyond an exterior main surface of the stack in which the component is embedded. In an embodiment, no re-wiring of the embedded component is needed, only a direct connection of the embedded component may be sufficient.

In the following, further exemplary embodiments of the manufacturing method, the system and the component carrier will be explained.

In an embodiment, the at least one electrically conductive connection structure comprises or consists of at least one pillar, in particular at least one copper pillar. Such a pillar may be a column-shaped electrically conductive structure having a significantly larger length to diameter ratio than a pad of a component. Therefore, a pillar may extend from an exterior of the stack up to the embedded component to bridge a distance in between. Such a pillar may be connected to the component prior to the embedding process which simplifies the manufacturing procedure.

In an embodiment, the at least one electrically conductive connection structure comprises or consists of at least one pad, in particular at least one copper pad. Hence, it is also possible that the electrically conductive connection structure comprises a pad forming an exterior flat electrically conductive interface of the component, arranged at the component and/or spaced with regard to the component (for instance by a pillar). In other words, the electrically conductive connection structure may be also very short in a z-direction ensuring a substantially direct contact of the component at an exterior main surface of the component carrier.

In an embodiment, the at least one electrically conductive connection structure comprises or consists of at least one pad and at least one pillar on the at least one pad. In other words, one or more pillars of the component and one or more pads of the component may be vertically stacked to form an electrically conductive connection structure of the component. By configuring the electrically conductive connection structure as a combination of pillar(s) and pad(s), it is in particular possible to use a conventionally manufactured component such as a semiconductor chip and extend the vertical contact structure by attaching one or more pillars on each of the one or more pads. However, it is also possible that a component main body (for instance a semiconductor body) and a respective pad are spaced by a respective pillar.

Still referring to the previously described embodiment, the at least one pad may comprise at least one pad being spaced with regard to a main body (such as a semiconductor body in case of a semiconductor chip type component) of the component by the at least one pillar. In other words, said at least one pad may be spatially separated from the main body of the component with the pillar in between.

Additionally or alternatively, at least one pad may be formed directly on a main body (such as a semiconductor body in case of a semiconductor chip type component) of the component. The latter mentioned at least one pad may space the main body of the component with respect to the at least one pillar. Such a pad may be a pad serving as an electrically conductive terminal directly on the main body of the component. It may for instance be directly connected on one side with the main body of the component and on an opposing other side with a pillar.

In yet another embodiment, it is also possible to have a first pad on one end of the pillar facing the main body of the component and a second pad on an opposing other end of the pillar opposing the main body of the component. In such a scenario, the first pad and the second pad may be spaced by the pillar.

In an embodiment, the at least one electrically conductive connection structure has an aspect ratio of at least 0.3, in particular at least 0.5, more particularly at least 1, preferably at least 2. In the context of the present application, the term "aspect ratio" of the electrically conductive connection structure may particularly denote a ratio between a vertical length of the electrically conductive connection structure (i.e., a length in a direction perpendicular to a main surface of the component main body from which the electrically conductive connection structure extends) to a maximum diameter of the electrically conductive connection structure. For instance, the aspect ratio may be the ratio between height of a pillar and diameter of the pillar. With the mentioned relatively large aspect ratios it may be possible to safely embed a component in the stack while at the same time ensuring that a sufficiently long electrically conductive contact can be provided which extends up to or even beyond a surface of the stack.

In an embodiment of the component carrier and the system, the exposed electrically conductive connection structure is configured for a direct electric connection to an electronic periphery, in particular to a further component, more particularly to a further semiconductor chip. Correspondingly, the method may comprise directly electrically connecting the exposed electrically conductive connection structure to an electronic periphery, in particular to a further component, more particularly to a further semiconductor chip. Thus, such an embodiment makes it possible to directly contact a further electronic member with the exposed electrically conductive connection structure of the component. This keeps the electric paths extremely short and signal losses small. In particular, when a further component being surface-mounted on the component carrier is directly connected to the electrically conductive connection structure, an extremely short z-connection can be established. Also, the contact paths from the component carrier to a vertically connected module are very short.

In an embodiment, the exposed electrically conductive connection structure is configured for being connectable with an electronic periphery without a redistribution layer. Correspondingly, the method may comprise connecting the exposed electrically conductive connection structure with an electronic periphery without a redistribution layer. Highly advantageously, a separate redistribution structure or layer between the embedded component and an electronic periphery of the component carrier may be omitted. Conventionally, such a redistribution layer provides an interface between the small dimensions of the semiconductor world corresponding to dimensions of pads of a chip-type component on the one hand and the larger dimensions of the PCB (printed circuit board) world on the other hand. By directly using the embedded and exposed electrically conductive connection structures belonging to the component for establishing an electric connection to an electronic periphery of the component carrier, the formation of an RDL (redistribution layer) may become dispensable, and the electrically conductive contact paths can be rendered very short.

In another embodiment, the exposed electrically conductive connection structure is configured for being connectable with an electronic periphery by a redistribution layer. The redistribution layer may be at least partially formed by the electrically conductive connection structure, and optionally a solder structure thereon.

In an embodiment, the embedded component is provided with a plurality of electrically conductive connection structures extending from the same main surface of a component main body in parallel to one another. Such an architecture (compare for instance FIG. 1) allows establishing even complex electric interconnections in a simple way.

In an embodiment, at least one exposed free end of the at least one electrically conductive connection structure is provided or covered with solder material. Thus, solder material may be added to the exposed end of the at least one electrically conductive connection structure for simplifying a solder procedure of connecting the embedded component with an electronic periphery of the component carrier by soldering, for instance with a surface-mounted further component. When the electrically conductive connection structure comprises a pillar (for instance a copper pillar), the free end of the pillar may be covered with solder material, before or after the embedding procedure. For example, such a solder coating at the flange surface of the exposed pillar may have the same diameter as the pillar (compare for instance FIG. 10) or may have a larger diameter than the pillar (compare for instance the detail in FIG. 7).

In an embodiment, at least one exposed free end of the at least one electrically conductive connection structure is provided with at least one pad, the at least one pad being in particular covered with solder material. For instance, a free end of a pillar may be covered with a pad having a lateral dimension larger than the pillar, wherein the pad may be covered, in turn, by solder material (compare for instance FIG. 7). In such an embodiment, even an exposed pad of the embedded component may be covered with a cap of solder material for simplifying a solder connection between the component carrier with its embedded component on the one hand and a further component or the like on the other hand.

In embodiments, the component carrier comprises at least one further component embedded in the stack, and being in particular electrically connected to the component. For instance, such at least one further embedded component may be a passive component (such as a capacitor, an inductance or an ohmic resistance), whereas the beforementioned component may be an active component (such as a microprocessor).

In an embodiment, the method comprises embedding the component in a cavity of the stack. The component may be inserted face up into the cavity, i.e., with the one or more electrically conductive connection structures oriented upwardly and facing away from the bottom of the cavity. Such a cavity may be a blind hole extending through only a part of the thickness of the stack and delimiting a component accommodation volume at sidewalls and at a bottom. Formation of a cavity (i.e., a blind hole) in the stack (for instance in a central core thereof) or in a peripheral portion of the stack renders it possible to easily embed the component by simply placing it in the cavity. For instance, the cavity may be formed by mechanically drilling, laser processing, etching, etc. In a preferred embodiment, the method comprises forming the cavity by integrating a non-adhesive release structure in the stack, and removing a piece of stack material above the release structure to thereby obtain the cavity. The piece may be spatially delimited by the non-adhesive release structure and by a circumferential cutting line, which may be formed for instance by mechanically cutting or laser cutting. According to such a preferred embodiment, a release layer made of a material having non-adhesive properties with regard to surrounding component carrier material is firstly embedded in the stack. Secondly, a portion of the stack above the release layer can be removed by cutting a circumferential line from an exterior of the stack extending up to the release layer. This can for instance be accomplished by mechanically drilling or by laser drilling. Due to the non-adhesive properties of the release layer, the circumferentially separated piece of the stack above the release structure or layer can subsequently be simply taken out of the stack, and a cavity may be obtained. The component may be subsequently simply placed inside the cavity for embedding.

In another embodiment, the method comprises embedding the component in a through-hole extending through the stack. In such an embodiment, the component accommodation volume may extend through the entire stack. For inserting the component in the through hole, a bottom of the through hole may be temporarily closed by a temporary carrier such as an adhesive tape.

In still another embodiment, the method comprises pressing the component, in particular having a thickness of less than 50 µm, between opposing planar layer structures of the stack. In such an embodiment, no component accommodation volume is formed in the stack at all. In contrast to this, the thin component is simply pressed between opposing planar electrically insulating layer structures which are preferably at least partially uncured at the time of pressing. Thus, the component may be simply laminated (rather than being molded) between planar layer structures. For instance, a suitable material of such layer structures is uncured resin which may be triggered to start cross-linking in the presence of pressure and/or temperature during embedding of the component between such layer structures. As a result, the previously at least partially uncured layer structures may become fully cured and the component may be reliably connected in between by lamination. This is particularly advantageous when the thickness of the component is less than 50 µm, for instance a thin naked semiconductor die, since the embedding of such thin semiconductor chip-type components between planar uncured layer structures has turned out to be possible without warpage or the like.

In an embodiment, the method comprises inserting the component, having an adhesive structure at least on a bottom surface, into the stack to thereby connect the component with the stack. In such an embodiment, an adhesive structure is already connected to the component itself before embedding so that insertion of the component in the stack and the application of mechanical pressure and/or heat triggers formation of an adhesive connection between the component and the stack.

In an embodiment, the method comprises inserting the component into the stack, providing an adhesive structure, to thereby connect the component with the stack. In such an embodiment, a (for instance liquid) adhesive may be dispensed or printed in a bottom region of a cavity type component accommodation volume which has been previously formed in the stack. Preferably, such an adhesive material may be configured so that it is cured during pressing the component on the adhesive or at least during laminating further layer structures onto a top surface and/or bottom surface of the stack with one or more components inserted therein. Thus, it is also possible that the stack itself is provided with an adhesive structure, for instance an at least partially uncured resin (such as prepreg) so that pressing the component on such an adhesive structure of the stack, preferably accompanied by heat, may trigger a formation of an adhesive connection between the component and the stack.

In an embodiment, the method comprises inserting the component into the stack, and subsequently providing an adhesive structure to the component and the stack to thereby connect the component with the stack. In such an embodiment, it is possible to add an adhesive material after having placed the component in the cavity or through-hole. For instance, such an adhesive may be dispensed above the component and in side gaps between component and stack, and may be subsequently cured. In another alternative, at least one further at least partially uncured layer structure may be attached (preferably laminated) to a top main surface so that the corresponding resin of the uncured layer structure may become flowable and may therefore form an adhesive connection between the component and the stack.

In an embodiment, the adhesive comprises filler particles, in particular with dimensions in a range between 0.1 μm and 5 μm, more particularly in a range between 0.5 μm and 1 μm. Referring to any of the previously described embodiments, the adhesive may comprise filler particles with the mentioned dimensions so as to adjust the physical properties of the component carrier accordingly. For example, such filler particles may at least partially equilibrate a mismatch between the coefficients of thermal expansion of the material of the component (for instance a semiconductor material such as silicon) and the material of the stack (copper and resin, optionally comprising reinforcing particles such as glass fibers). It is also possible that the filler particles are functionalized in another way, for instance to increase the thermal conductivity of the component carrier. The filler particles may also be selected so as to improve the high frequency characteristics of the component carrier, for instance may be made of a low k-material.

In an embodiment, the method comprises forming the stack by lamination. In the context of the present application, the term "lamination" may particularly denote that mechanical pressure and/or heat is used to render partially uncured material flowable, wherein a so triggered cross-linking of the previously at least partially uncured material may make the material re-solidify and become permanently adhesive.

In an embodiment, the method comprises connecting the component with the stack by an adhesive structure and subsequently removing, in particular by plasma treatment, a surface portion of the adhesive structure to thereby expose the at least one electrically conductive connection structure. According to such a preferred embodiment, the electrically conductive connection structures are firstly completely embedded within the stack and are covered without being exposed to an exterior main surface of the component carrier with adhesive dielectric material. However, by subsequently carrying out a plasma process, it may be possible to selectively remove material of the adhesive from the top surfaces of the one or more electrically conductive connection structures and to therefore reliably expose such surfaces. When the material removal procedure is adjusted so that it does not remove material of the electrically conductive connection structure(s), it may be possible to render the electrically conductive connection structure(s) to protrude beyond the surrounding dielectric material, which may render a subsequently formed electric connection between the protruding electrically conductive connection structure(s) and the electronic environment more reliably and accurately.

In an embodiment, the method comprises covering the at least one exposed free end of the at least one electrically conductive connection structure with solder material before the embedding. Providing a solder tip on the pillars (in particular having a substantially identical width as the pillars) of the component already before the embedding allows to—substantially immediately after embedding—establish a solder connection between the embedded component and an electronic periphery. This may be particularly advantageous in an embodiment in which the component, before its embedding in the stack, has on one main surface an adhesive structure and on the opposing other main surface the electrically conductive connection structure(s) with the solder material thereon. The component may thus be prepared to contribute to both, adhesion with the stack and formation of a solder connection with an electronic periphery.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board. A plate-shaped component carrier also ensures short electric connection paths, and therefore suppresses signal distortion during transport.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide thermal, electrical and/or mechanical connections of housed components or unhoused components (such as bare dies), particularly of IC chips, with a printed circuit board or an intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene.

In an embodiment, the electrically insulating layer structure(s) may comprise at least one of the group consisting of resin (such as reinforced or non-reinforced resins, for instance epoxy resin or Bismaleimide-Triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (Teflon®), a ceramic, and a metal oxide. Teflon® is a registered mark of The Chemours Company FC LLC of Wilmington, Delaware, U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film or photo-imageable dielectric material may be used as well. For high-frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

In an embodiment, the electrically conductive layer structure(s) may comprise at least one of the group consisting of copper, aluminum, nickel, silver, gold, palladium, and tungsten. Although copper is usually preferred, other materials or coated versions thereof are possible as well, in particular materials coated with supra-conductive material such as graphene.

In an embodiment, the semiconductor component may be a power semiconductor chip comprising a transistor and/or a diode. However, the semiconductor component may also be a microprocessor. In yet another embodiment, the semiconductor component may be a radio-frequency semiconductor chip configured for emitting and/or receiving radio-frequency signals. Hence, the semiconductor component may be configured for executing a radio-frequency application, in particular a radio-frequency application involving frequencies above 1 GHz.

At least one further component may be surface mounted on and/or embedded in the component carrier and can in particular be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal-processing component, a power-management component, an optoelectronic interface element, a light-emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

The aspects defined above and further aspects of the invention are apparent from the examples of embodiment to be described hereinafter and are explained with reference to these examples of embodiment.

DETAILED DESCRIPTION OF EXEMPLARY EMBODIMENTS

Figure 1:
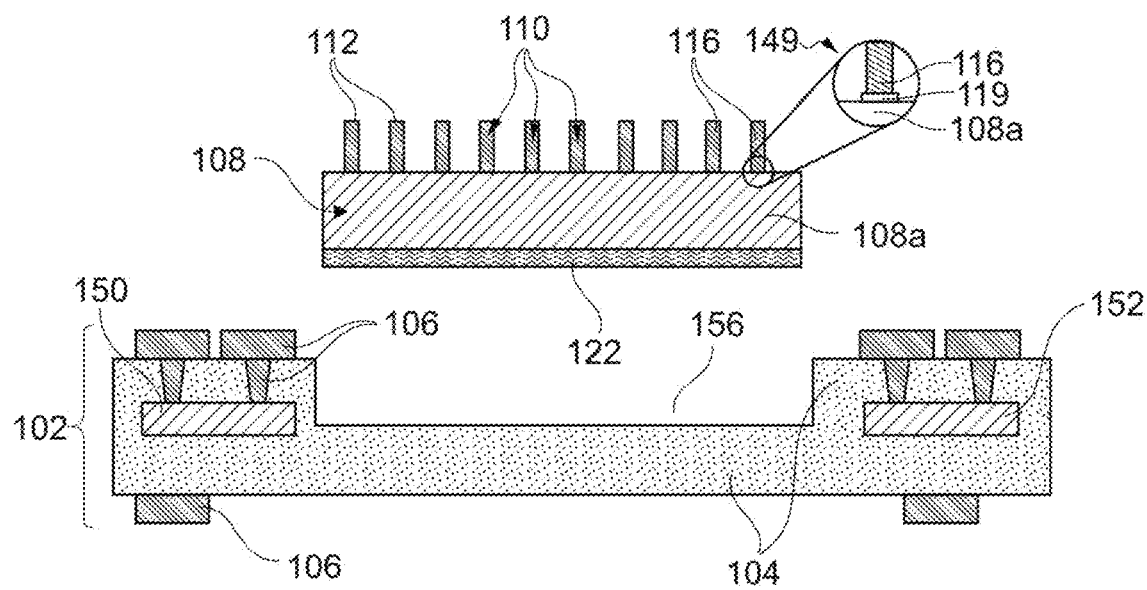
FIG. 1, FIG. 2, FIG. 3, FIG. 4, FIG. 5, FIG. 6, FIG. 7 to FIG. 8 illustrate cross-sectional views of structures obtained during carrying out a method of manufacturing a component carrier with an embedded component, shown in FIG. 8 as part of a system composed of the component carrier and a module, according to an exemplary embodiment of the invention.

The illustrations in the drawings are schematically presented. In different drawings, similar or identical elements are provided with the same reference signs.

Before, referring to the drawings, exemplary embodiments will be de-scribed in further detail, some basic considerations will be summarized based on which exemplary embodiments of the invention have been developed.

According to an exemplary embodiment of the invention, a component carrier is provided in which a (preferably direct) contacting of one more component may be accomplished using copper pillar technology, or another appropriate vertical connection structure. In particular by using copper pillars for providing a z-axis connection of the embedded component, it is possible to obtain a high registration accuracy on the component (in particular chip). Using one or more copper pillars as connection structure may be also advantageous, because it may allow to achieve a higher aspect ratio than obtainable with laser via connections, for instance in a range between 2:1 and 1:1. Particularly advantageous is the use of copper pillars for z-axis interconnection with face-up assembly of the component in a cavity of the stack. This may allow to establish an electric coupling of a memory-processor connection, a connection to power modules, a connection with one or more antennas, etc.

One exemplary embodiment of the invention allows the application of a rewiring layer on the surface of the package. The diameter of corresponding copper pillars may be preferably smaller than the connecting surface of the rewiring layer. By this embodiment, the registration area of the copper pillar may increase to the pad.

According to another exemplary embodiment of the invention, a solder depot may be provided on the electrically conductive connection structure(s) to produce a direct contact of outer components to the internal connection component (for example an active component with copper pillar). Additionally, it is possible that such an external component is also connected to other connection points and internal components.

In a further embodiment, it is possible to apply a module on said two mentioned embodiments.

A corresponding component carrier or device may also be designed as a module that may contain components. The connection paths may thereby be reduced to a shorter or even shortest possible extent.

A component carrier or module according to an exemplary embodiment can also be implemented as a power core. It is also possible to provide a module which may be implemented as a rewiring subcarrier (for example a silicon interposer, an HDI (high-density integration) organic interposer).

Figure 3:
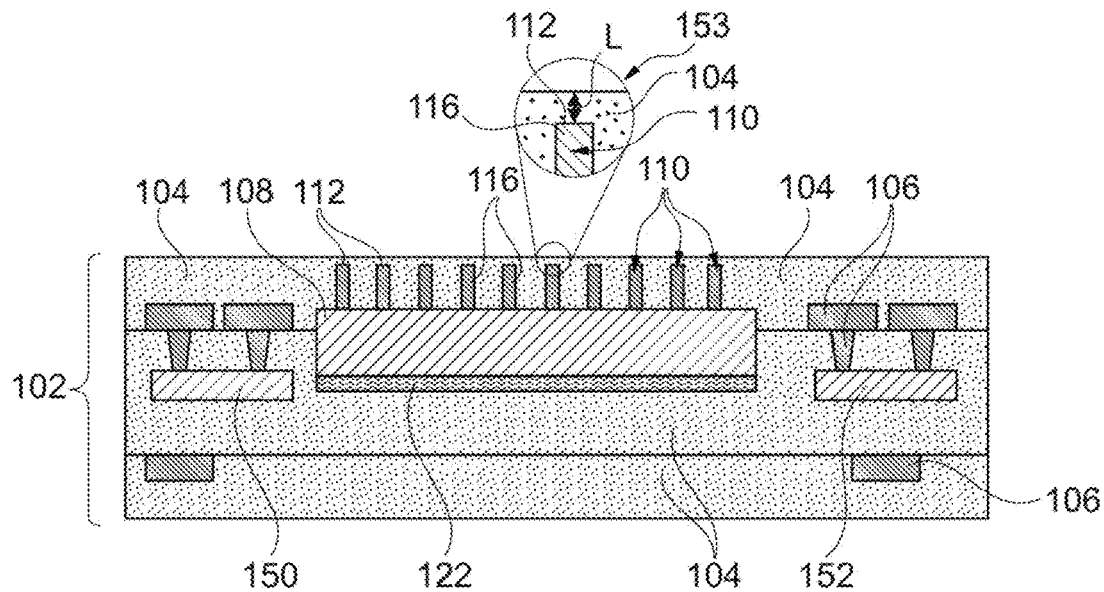
Figure 4:
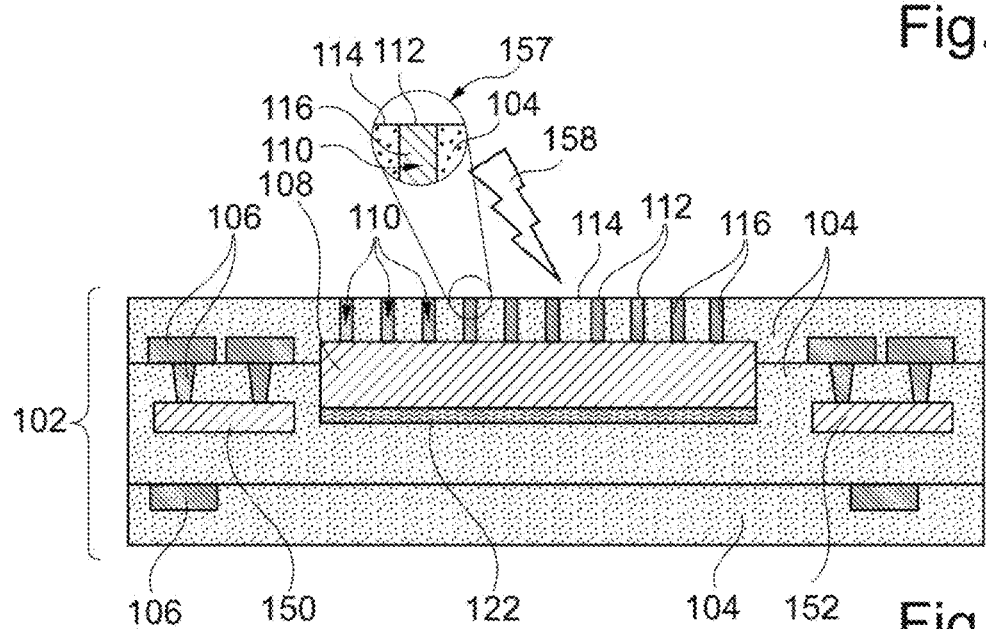
Figure 5:
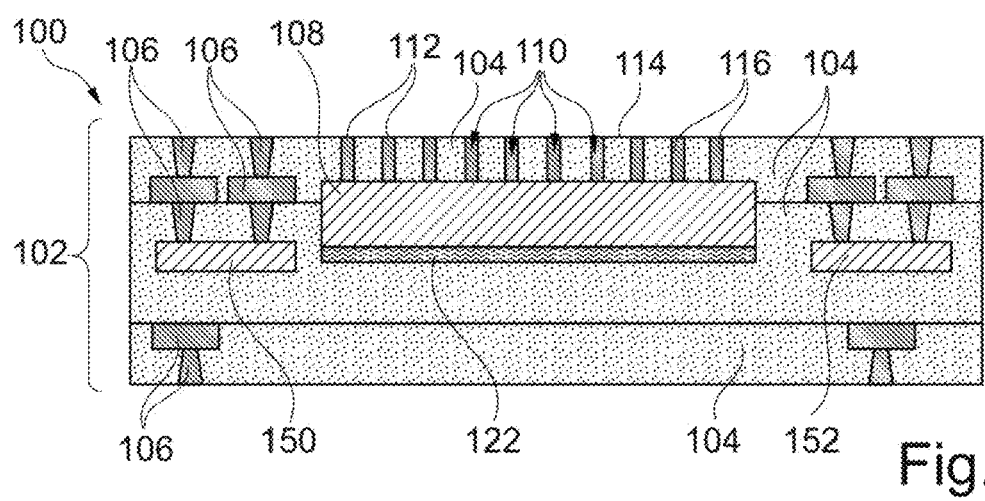
Figure 6:
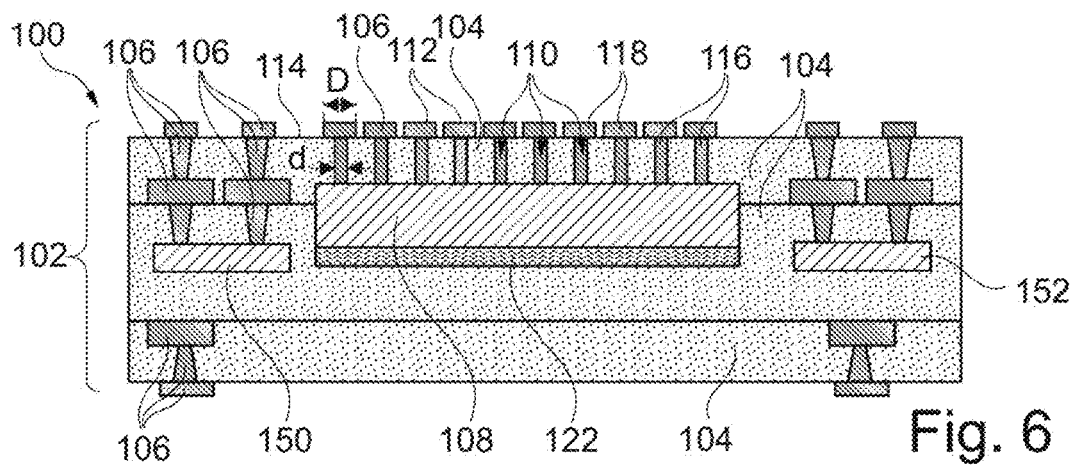
Figure 7:
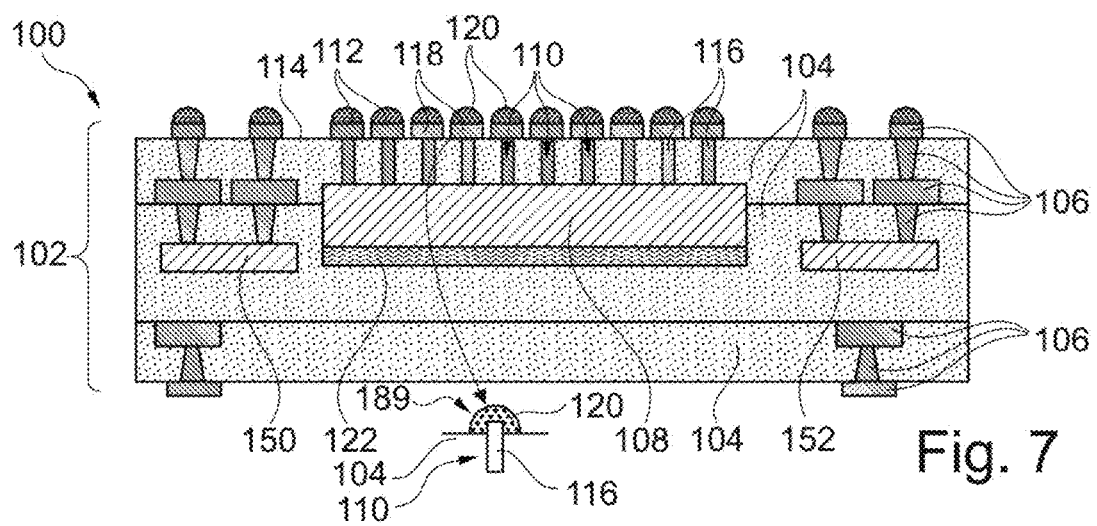
Figure 8:
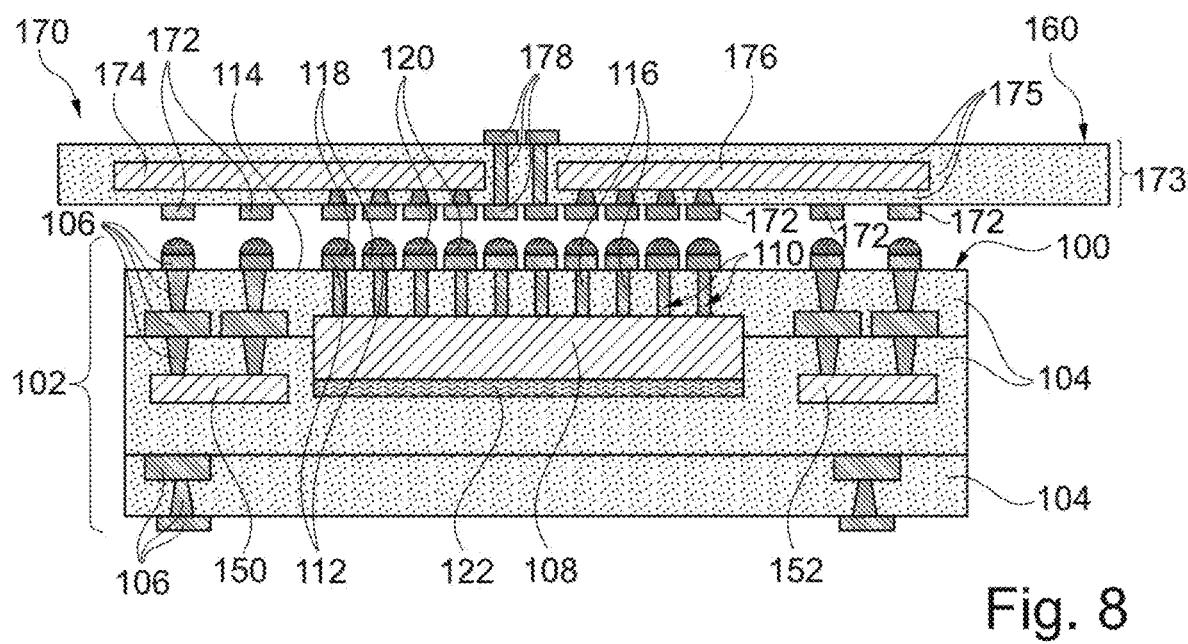

FIG. 1 to FIG. 8 illustrate cross-sectional views of structures obtained during carrying out a method of manufacturing a component carrier 100 with an embedded component 108. Such a component carrier 100 according to an exemplary embodiment of the invention is shown in FIG. 5 to FIG. 7. In FIG. 8, the component carrier 100 is illustrated as part of a system 170 according to an exemplary embodiment of the invention composed of the component carrier 100 and a module 160. These embodiments may be used, for example, in substrate technology.

Referring to FIG. 1, a laminated stack 102 is provided which comprises electrically conductive layer structures 106 and electrically insulating layer structures 104, being connected with one another by lamination (i.e., the application of heat and/or pressure). As shown, the layer stack 102 is composed of multiple planar layer structures 104, 106 so that the formed component carrier 100 is a plate-shaped laminate type printed circuit board (PCB) component carrier. The electrically conductive layer structures 106 are composed of patterned metal layers such as patterned copper foils and may also comprise vertical through connections such as copper filled laser vias. The electrically insulating layer structures 104 may comprise sheets comprising resin (in particular epoxy resin), optionally comprising reinforcing particles (such as glass fibers or glass spheres) therein. For instance, the electrically insulating layer structures 104 may be made of prepreg. A cavity 156 is formed in the stack 102.

Passive components 150, 152, such as capacitors or inductances, are embedded in the stack 102.

FIG. 1 also illustrates an active component 108 (such as a semiconductor chip embodied as microprocessor) to be embedded in the cavity 156 of the stack 102. As shown, component 108 has a plurality of electrically conductive connection structures 110 extending upwardly and in parallel to one another. According to FIG. 1, the component 108 is arranged above the stack 102 with the electrically conductive connection structures 110 facing away from the stack 102 so as to bring the component 108 into a configuration in which it may later be inserted into the cavity 156 (compare FIG. 2). At a bottom surface, the component 108 comprises a layer of an adhesive structure 122.

Although not shown, it is also possible to modify the described manufacturing method by embedding the component 108 not in a cavity 156, but in contrast to this in a through-hole extending through the entire stack 102.

Further alternatively and also not shown, it is possible that the component 108 is embedded by being pressed between opposing planar layer structures of the stack 102. This may be particularly advantageous for components 108 with very small thickness, for instance thin naked semiconductor dies having a thickness of less than 50 μm.

Again, referring to FIG. 1, the component 108 is covered with an adhesive structure 122 on a bottom main surface facing the stack 102 and facing away from the connection structures 110. By this adhesion structure 122 integrated in the component 108, it is subsequently possible to insert the component 108 into the cavity 156 of the stack 102 to thereby connect the component 108 with the stack 102 by the adhesive function of the adhesion structure 122. Additionally or alternatively, adhesive material may be placed in the cavity 156. However, providing the adhesive structure 122 as part of the component 108 renders the manufacturing process particularly simple, because dispensing adhesive material in the cavity 156 may then be dispensable. The component 108 to be embedded in the stack 102 is thus provided with a die attach film as adhesive structure 122 at a bottom main surface of the component 108.

On the opposing other main surface, the active component 108 is provided with an array of copper pillars 116 as electrically conductive connection structures 110. The copper pillars 116 extend from a main body (in particular a semiconductor block) of the component 108 up to a free end 112. The component 108 is ready for being inserted into the cavity 156 of the stack 102. The stack 102 may be configured as a substrate with the cavity 156 and the already embedded components 150, 152.

As illustrated by a detail 149, an electrically conductive pad 119 may be provided between a main body 108a of the component 108 on the one hand and a respective pillar 116 on the other hand. Hence, a component 108 may be provided on one or both opposing main surfaces of its main body 108a with one or more such electrically conductive pads 119 as electric terminals. Hence, also such one or more conductive pads 119 may form part of or may even form an entire connection structure 110 of any embodiment of the invention. For the sake of conciseness, such pads 119 are only shown in FIG. 1, but may be present in each embodiment described referring to the figures.

As shown in FIG. 1, the pad 119 can be protruding in a vertical direction from the main body 108a of the component 108, but does not need to. Alternatively, the contact pad 119 at the main body 108a of the component 108 can also be flush with the outer surface of the main body 108a or even located in a (for instance ever so slight) recess (not shown). Thus, the pads 119 can, but do not need to, be protruding, and may be denoted generally as electrical contacts at an outer surface delimiting a component 108.

Figure 2:
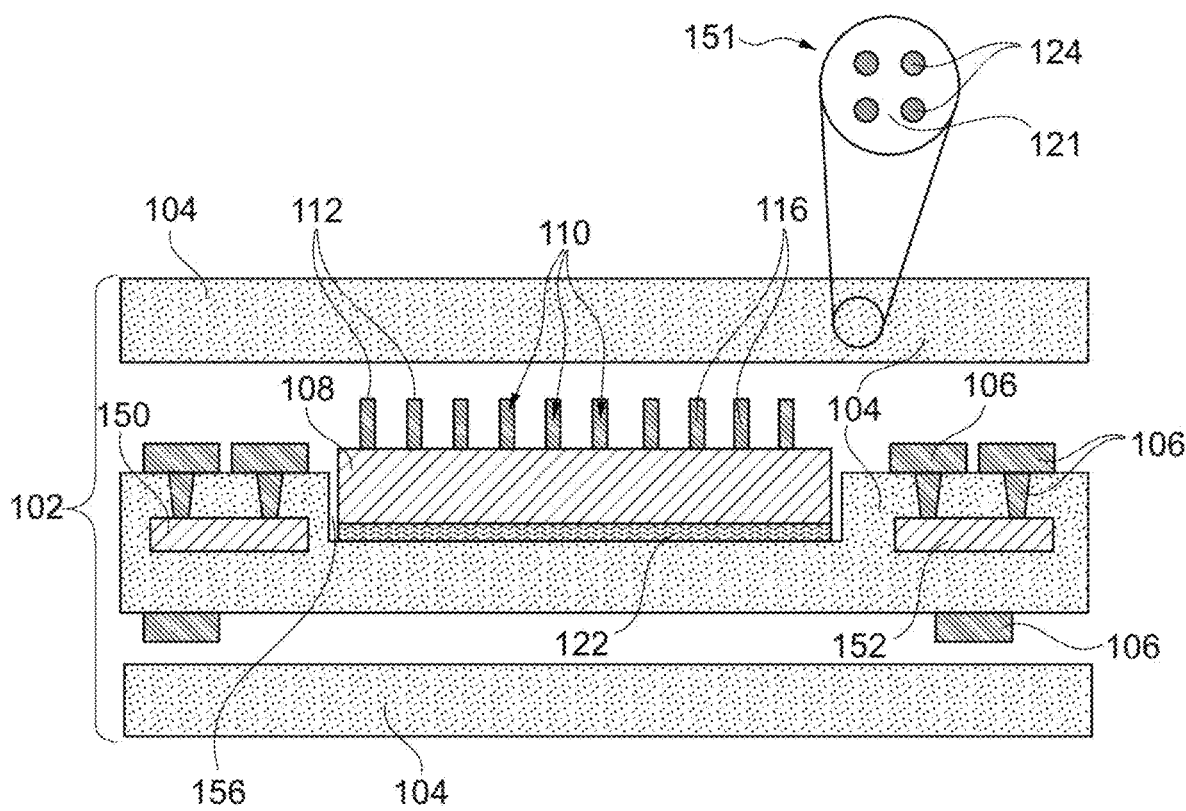

Referring to FIG. 2, the component 108 may be inserted and fitted in the cavity 156. In the shown embodiment, the assembly area at the bottom of the cavity 156 has no copper, i.e., has no electrically conductive material of the electrically conductive layer structures 106. An advantage of this is the reduction of the CTE (coefficient of thermal expansion) stress. The assembly takes place supported by an attached film of adhesive material on the component 108 or by the application of a liquid adhesive on the back of the component 108 (compare adhesive structure 122 in FIG. 1). Thus, in order to obtain the central body of the structure shown in FIG. 2, the component 108 is inserted into the cavity 156 of the stack 102 so that the adhesive structure 122 on the back main surface of the component 108 connects the component 108 and the stack 102.

Moreover, two uncured resin films in B-stage may be provided as further adhesive structures 122 which may be laminated onto the central body of FIG. 2 composed of the stack 102 and the component 108. These layer-shaped further adhesive structures 122 may comprise a matrix 121 of still uncured resin in which filler particles 124 with diameters in a range between 0.5 μm and 1 μm are located (as indicated schematically in a detail 151 in FIG. 2). The filler particles 124 may be selected to fine tune the properties of the layer type further adhesive structures 122 in the framework of the readily manufactured component carrier 100. For instance, the filler particles 124 may serve for reducing a CTE mismatch, enhancing thermal conductivity, etc.

Hence, FIG. 2 shows the structure shown in FIG. 1 after having inserted the component 108 into the cavity 156 so that the adhesive structure 122 of the component 108 is attached to a bottom of the cavity 156. Subsequently, the so obtained structure is sandwiched between the two opposing electrically insulating layer structures forming the further adhesive structures 122, which are here embodied as at least partially uncured dielectric sheets. For instance, said layer type further adhesive structures 122 may comprise epoxy-based build-up material such as ABF® (Ajinomoto Build-up Film) or prepreg material. ABF® is a registered mark of Ajinomoto Co., Inc. of Tokyo, Japan.

The structure shown in FIG. 3 may be obtained by connecting the central structure and the peripheral layers shown in FIG. 2 by lamination, i.e., by the application of mechanical pressure and/or thermal energy. During lamination, the previously uncured material of the further adhesive structures 122 becomes flowable, cross-links, solidifies and is thereby cured. As a result of this lamination, the copper pillar type connection structures 110 are completely embedded in material of the upper one of the further adhesive structures 122. After said lamination, the free ends 112 of the connection structures 110 are already located very close to the surface (for instance with a distance, L, in a range between 0.5 μm and 5 μm, compare detail 153).

Referring to FIG. 4, the free ends 112 of the electrically conductive connection structures 110 are exposed with respect to the stack 102 by a plasma treatment (as indicated schematically by reference numeral 158) so that the free exposed ends 112 flush with (or even extend beyond, as in FIG. 12) an exterior main surface 114 of the stack 102. In other words, the free exposed ends 112 are now aligned with the planar exterior main surface 114 of the stack 102, as also illustrated in a detail 157. Thus, after having connected the component 108 with the stack 102 by the adhesive structures 122, the plasma treatment subsequently removes a surface portion of the uppermost adhesive structure 122 to thereby expose the electrically conductive connection structures 110. Exposing the copper pillars 116 may be done by plasma, or alternatively by another material removal procedure such as mechanical grinding and/or a chemical process. Thus, the electrically conductive connection structures 110 may be exposed for accomplishing a direct electric component interconnection.

In order to obtain the component carrier 100 shown in FIG. 5, further electrically conductive layer structures 106 in form of copper filled laser vias may be formed in the upper and lower electrically insulating layer structures 104 by laser drilling followed by copper plating. As a result, inner electrically conductive layer structures 106 may be connected up to an exterior surface of the component carrier 100 shown in FIG. 5.

Referring to FIG. 6, a further rewiring layer is formed on a top main surface and a bottom main surface of the component carrier 100 of FIG. 5, so as to provide additional connection surfaces.

More precisely, in order to obtain the component carrier 100 shown in FIG. 6, all exposed electrically conductive surfaces of the structure shown in FIG. 5 may be covered with pads 118. For instance, this may be accomplished by laminating copper foils on both the upper main surface and the lower main surface of the component carrier 100 shown in FIG. 5, followed by a corresponding patterning procedure. This patterning may be carried out by a lithography and etching procedure. Thus, exterior electrically conductive connection surfaces can be formed.

As shown, the pillars 116 may have a smaller diameter, d, than the diameter, D, of the pads 118. For example, diameter, d, of the copper pillars 116 may be in a range between 15 μm and 20 μm. In contrast to this, diameter, D, of the pads 118 (which may also be denoted as lands) may be 44 μm (or more generally in a range between 30 μm and 60 μm). This may correspond to a registration tolerance of ±12 μm.

Referring to FIG. 7, a solder deposit is formed. Thereafter, finalization of the PCB type component carrier 100 may be achieved (for instance by formation of a solder mask, etc.). Thus, the illustrated component carrier 100 according to an exemplary embodiment of the invention may be obtained by depositing solder material 120 on exposed electrically conductive surfaces, and in particular on the pads 118, on the upper main surface of the structure of FIG. 6. In the shown embodiment, the solder structures 120 are shaped as hemispherical bodies. Said solder structures 120 simplify a solder connection which may be established for electrically connecting the embedded component 108 and the passive components 150, 152 with an electronic environment.

As illustrated in a detail 189 in FIG. 7, it is alternatively also possible that solder structures 120 directly cover pillars 116 (i.e., also when pads 118 on top of pillars 118 are absent). In such an embodiment, it is possible that the solder structures 120 partially cover a horizontal flange face of the pillars 116, as well as part of the lateral surface of the pillars 116.

FIG. 7 shows a cross-sectional view of the component carrier 100 with the stack 102 composed of electrically insulating layer structures 104 and electrically conductive layer structures 106. The active component 108 with its parallel and vertically upwardly extending electrically conductive connection structures 110 in form of copper pillars 116 and pads 118 is partially embedded in the stack 102 and is partially exposed with regard to the stack 102. More specifically, the electrically conductive connection structures 110 of the component 108 are exposed with respect to the stack 102 so that a respective free exposed end 112 of the electrically conductive connection structure 110 of the component 108 slightly protrudes beyond an exterior main surface 114 of the stack 102. More precisely, the electrically conductive connection structures 110 comprise pads 118 or lands, each of which being formed on a respective one of the pillars 116. The pillars 116 have an aspect ratio (i.e., a ratio between height and diameter) of larger than one so as to establish an expanded z-axis connection within the component carrier 100. Said exposed electrically conductive connection structures 110 are configured for a direct electric connection of the embedded component 108 to the electronic periphery by soldering the solder structures 120 on top of the electrically conductive connection structures 110 on the electronic periphery. Each of said exposed free ends 112 of the electrically conductive connection structures 110 corresponds, according to FIG. 7, to the end face of a respective pad 118 being covered, in turn, with a half sphere of solder material in form of solder material 120.

Alternatively, for instance in the absence of pads 118, the exposed free ends 112 of the electrically conductive connection structures 110 may be formed by horizontal end faces of the pillars 116 flushing or being aligned with the main surface 114, as shown in FIG. 5.

Hence, the mentioned geometry allows the application of a rewiring layer on the surface of the package or component carrier 100. The diameter of the copper pillars 116 is smaller than the connecting surface of the rewiring layer. By this embodiment, the registration area of the copper pillars 116 increases to the size of the respective pad 118.

Referring to FIG. 8, the exposed electrically conductive connection structures 110 of the component carrier 100 may be directly solder connected, by the solder structures 120, with a module 160 comprising further components 174, 176, which may be embodied as semiconductor chips (for instance memory chips).

Thus, FIG. 8 shows the component carrier 100 according to FIG. 7 together with module 160. In order to obtain a system 170, the module 160 and the component carrier 100 can be connected by connecting exposed pads 172 of the module 160 with the solder material 120 on the upper main surface of the component carrier 100. As shown, the module 160 may comprise embedded components 174, 176, such as semiconductor chips. Said semiconductor chips may for instance be memory chips or a microprocessor. The components 174, 176 are embedded in a further stack 173 composed of further electrically insulating layer structures 175 and further electrically conductive layer structures 178. As a result of the embedding of component 108 in component carrier 100 in such a way that the electrically conductive connection structures 110 extend up to and optionally even beyond the upper main surface 114 of the component carrier 100, the electric paths in z-directions are extremely short. This enables a low loss transport of signals and keeps the obtained system 170 highly compact.

Figure 9:
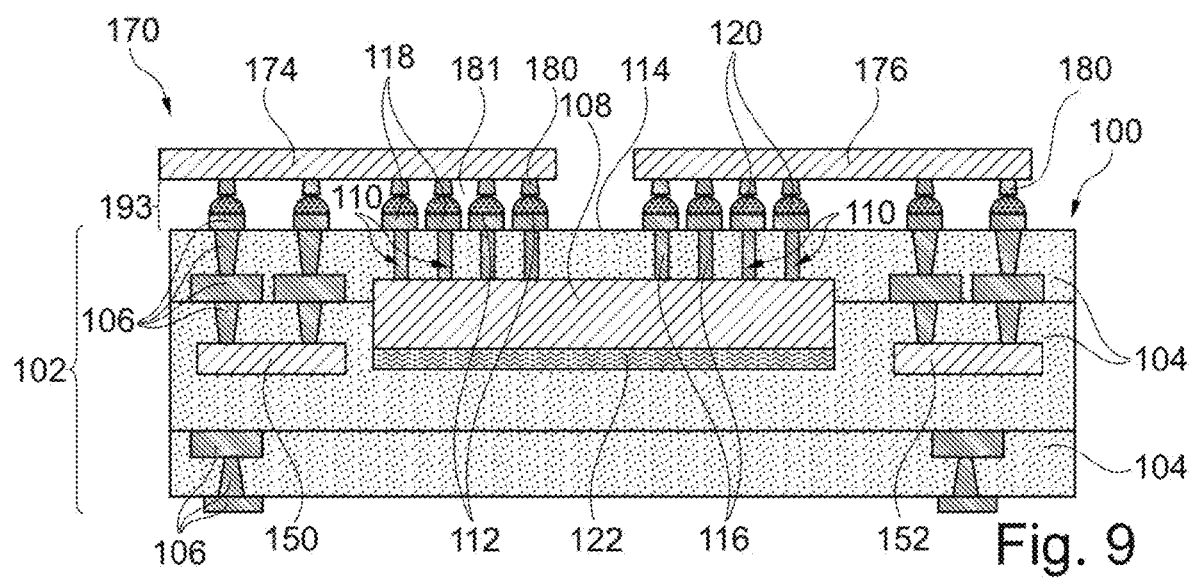
FIG. 9 illustrates a cross-sectional view of a system composed of a component carrier, which may be manufactured as described referring to FIG. 1 to FIG. 7, and further surface mounted components according to another exemplary embodiment of the invention.

FIG. 9 illustrates a cross-sectional view of a system 170 composed of the component carrier 100 manufactured according to FIG. 1 to FIG. 7 and further surface mounted components 174, 176 according to another exemplary embodiment of the invention.

Thus, FIG. 9 illustrates another system 170 composed of the component carrier 100 according to FIG. 7 and further components 174, 176 being surface-mounted directly on the component carrier 100 by establishing a solder connection between pads 180 of the further components 174, 176 on the one hand and the solder material 120 on the other hand. For instance, the first further component 174 may be a processor and the second further component 176 may be a memory chip. More generally, said further components 174, 176 may be active or passive dies, microelectromechanical systems (MEMS), soldered antenna structures, modules, a further component carrier 100, etc. Optionally, an underfill may be provided to fill at least part of gaps 181 between the component carrier 100 and the further components 174, 176. The component 108 may for instance be a level shifter, an active die, a passive array (for instance silicon caps), a transceiver, etc.

With embodiments described referring to FIG. 1 to FIG. 9, a redistribution structure 193 may be provided on the surface of the component carrier 100. As shown in particular in FIG. 9 and FIG. 6, diameter, d, of the pillars 116 is smaller than diameter, D, of the lands or pads 118 (the latter corresponding to the connecting area of the redistribution structure 193. Thus, the registration area of the copper pillars 116 with respect to the connection area can be increased.

Figure 12:
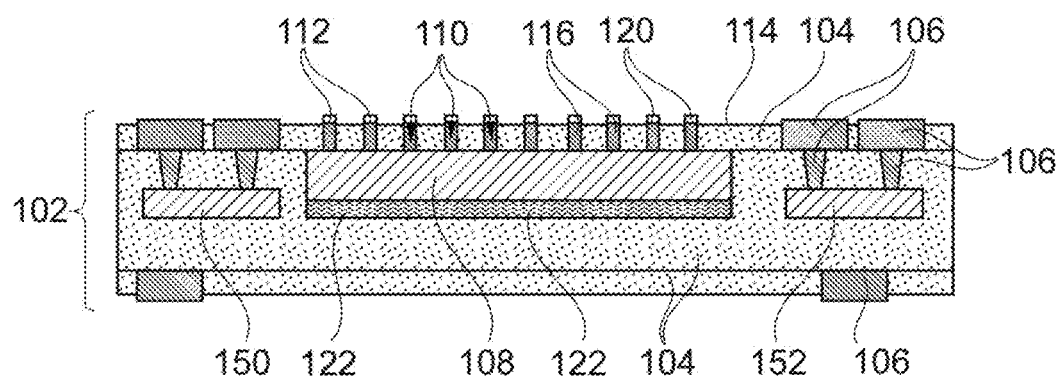
Figure 13:
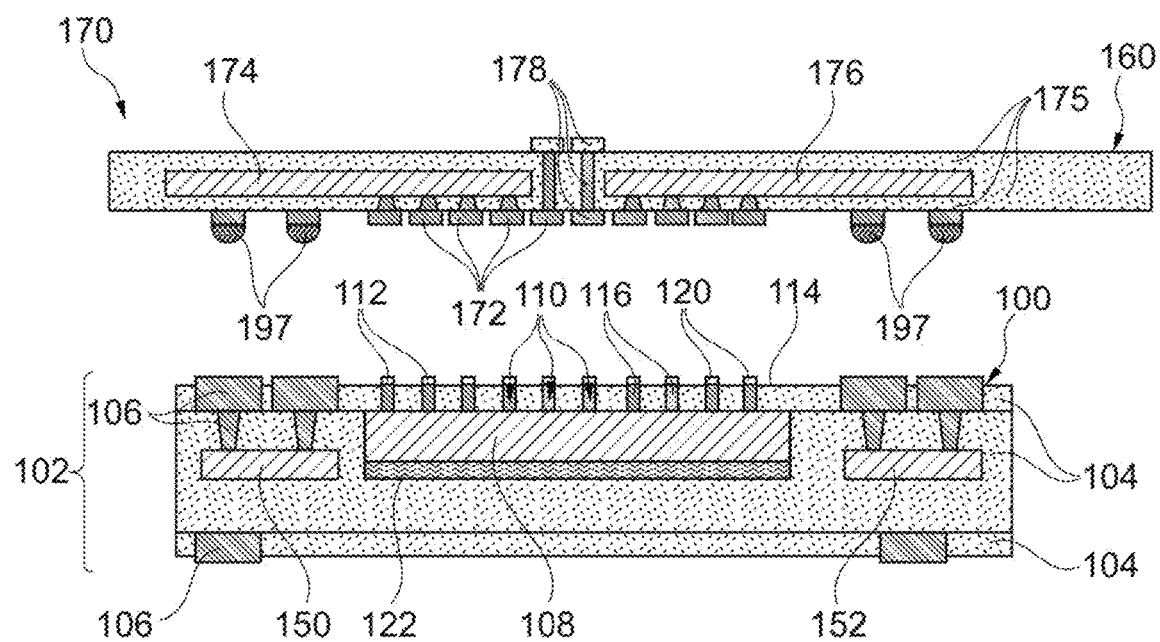
Figure 14:
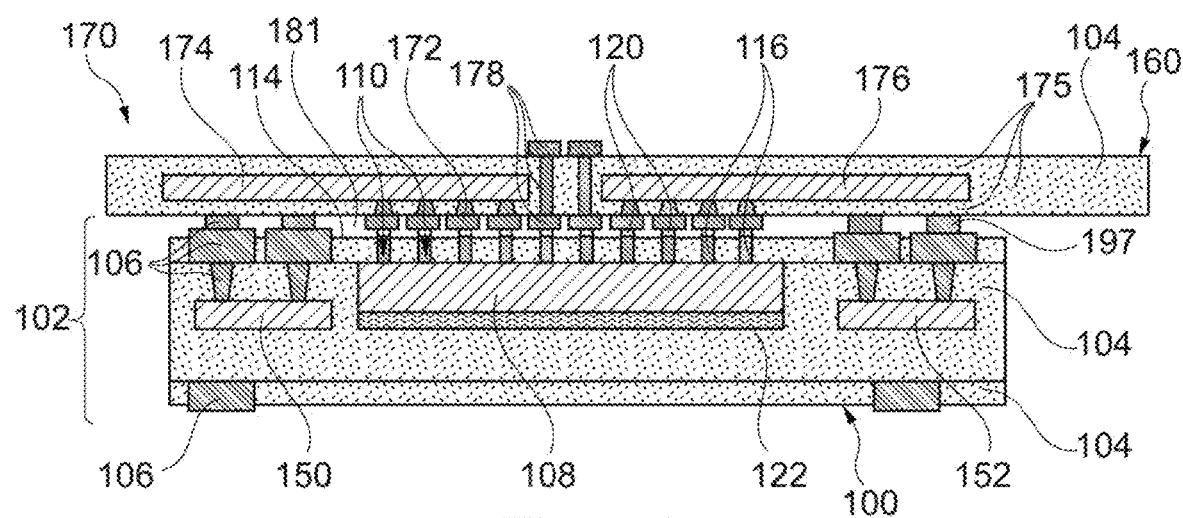

FIG. 10 to FIG. 14 illustrate cross-sectional views of structures obtained during carrying out a method of manufacturing a component carrier 100 with an embedded component 108, shown in FIG. 14 as part of a system 170 composed of the component carrier 100 and a module 160, according to yet another exemplary embodiment of the invention.

Figure 10:
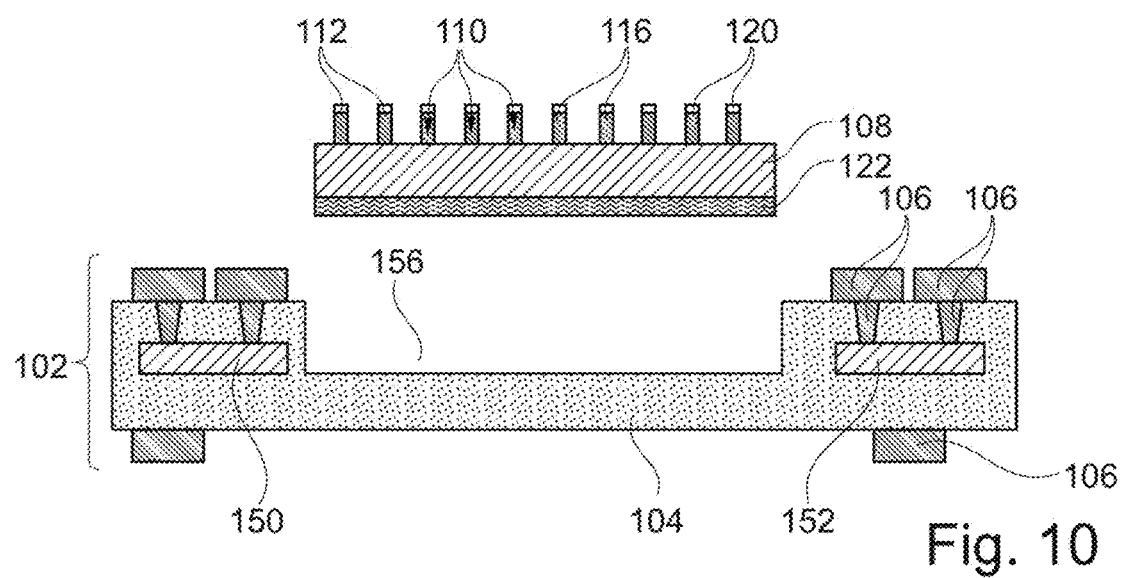
FIG. 10, FIG. 11, FIG. 12, FIG. 13 to FIG. 14 illustrate cross-sectional views of structures obtained during carrying out a method of manufacturing a component carrier with an embedded component, shown as part of a system composed of the component carrier and a module in FIG. 14, according to yet another exemplary embodiment of the invention.

The arrangement shown in FIG. 10 corresponds to the arrangement shown in FIG. 1 with the difference that, according to FIG. 10, exposed upper ends of the pillars 116 are covered with solder structures 120. Thus, the solder material 120 may be provided already before embedding the component 108 in the cavity 156. The embodiment described in the following can be denoted as an active bridge embodiment.

Figure 11:
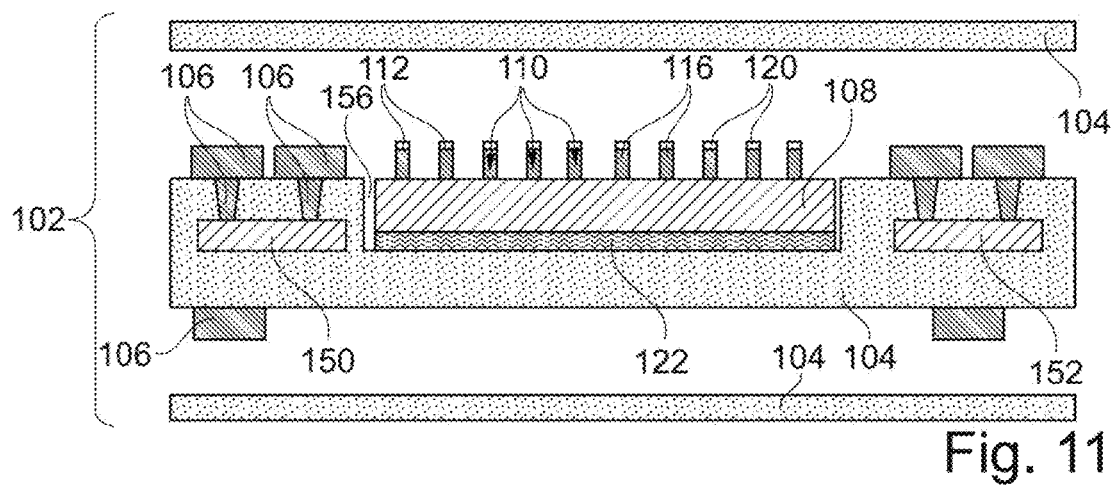

The layer structure shown in FIG. 11 can be obtained based on the structure shown in FIG. 10 in the same way as described above referring to FIG. 2.

In order to obtain the structure shown in FIG. 12, the electrically insulating layer structures 104 corresponding to the further layer type adhesive structures 122 may be laminated on top and bottom of the stack 102 with the inserted component 108, in a similar way as described referring to FIG. 3. However, in contrast to FIG. 3, the thickness of the further electrically insulating layer structures 104 to be laminated on top and on bottom and being made of uncured material may be formed sufficiently thin so that the solder material 120 on the pillars 116 remains exposed after the lamination process. This renders a plasma process or the like dispensable. In other words, in the lamination procedure according to FIG. 12, the copper pillars 116 with the solder material 120 are placed over the main surface 114 (for instance extending beyond the upper main surface 114 by 0.5 µm to 5 µm).

Directly thereafter and now referring to FIG. 13, a module 160 may be placed above the component carrier 100 for subsequent interconnection, in a similar way as described above referring to FIG. 8. However, according to FIG. 13, the land diameter, i.e., the lateral extension, of the pads 172 of the module 160 may be 50 µm. The pillars 116 may have a dimension of larger than 44 µm. The registration accuracy may be ±8 µm.

Still referring to FIG. 13, a respective solder depot (compare reference numeral 120) may already be preformed on the copper pillars 116 prior to the described embedding procedure, in order to produce a direct contacting of the external components to the internal connection component 108 (for example an active component 108 with copper pillars 116). More generally, such an external component may also be connected to another connection point and internal components.

FIG. 14 illustrates a cross-sectional view of system 170 according to an exemplary embodiment of the invention which may be obtained by connecting component carrier 100 with module 160. Hence, FIG. 14 shows the result of the interconnection between component carrier 100 and module 160 by soldering, so that the readily manufactured system 170 is obtained as illustrated in FIG. 14. As shown, the connection between component carrier 100 and module 160 can be established directly and without redistribution layer.

Optionally, an underfill may be filled in between the component carrier 100 and the module 160 (compare reference numeral 181).

The embodiment described referring to FIG. 10 to FIG. 14 uses a solder depot or solder material 120 directly on copper pillar 116 of component 108 for accomplishing a direct electric coupling of the exterior further components 174, 176 with the interior embedded component 108. It is also possible that the exterior further components 174, 176 are electrically coupled, via additional connection structures 197 with the further components 150, 152 of the component carrier 100.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A final component carrier, comprising:
a laminated stack having at least two electrically insulating layer structures and at least one electrically conductive layer structure;
a component having at least one electrically conductive connection structure and embedded in the laminated stack;
wherein the component is embedded in two electrically insulating layer structures with the component extending into one of the two electrically insulating layer structures for a first distance and extending into a remaining one of the two electrically insulating layer structures for a second distance different than the first distance;
wherein the at least one electrically conductive connection structure of the component is exposed with respect to the laminated stack so that a free exposed end of the at least one electrically conductive connection structure of the component is flush with or extends beyond an exterior main surface of the laminated stack, said exposed electrically conductive connection structure configured for an electric connection to an electronic periphery in a direction of the laminated stack;
wherein an adhesive structure is arranged on a surface of the component facing away from the exposed electrically conductive connection structure,
wherein the at least one electrically conductive connection structure comprises at least one monolithic pillar,
wherein the at least one monolithic pillar comprises a continuous sidewall that extends in a direction perpendicular to a main surface of the component from which the at least one monolithic pillar extends.

2. The final component carrier according to claim 1, wherein the at least one electrically conductive connection structure comprises or consists of at least one pad.

3. The final component carrier according to claim 1, wherein the at least one electrically conductive connection structure comprises at least one pad and at least one pillar on the at least one pad.

4. The final component carrier according to claim 3, wherein the at least one pad comprises at least one of the group consisting of:
at least one pad being spaced with regard to a main body of the component by the at least one pillar;
at least one pad directly on a main body of the component and spacing the main body of the component with respect to the at least one monolithic pillar.

5. The final component carrier according to claim 1, further comprising at least one of the following features:
wherein the at least one electrically conductive connection structure has an aspect ratio of at least 0.3;
wherein the exposed electrically conductive connection structure is coupled to a semiconductor chip;
wherein the exposed electrically conductive connection structure is configured for connecting the electronic periphery with or without redistribution structure;
wherein an at least one exposed free end of the at least one electrically conductive connection structure is covered with a solder material;
at least one further component embedded in the laminated stack, and being electrically connected to the component;
wherein the component is selected from a group consisting of a logic chip;
wherein the final component carrier is configured as one of the group consisting of a printed circuit board, and a substrate, or a preform thereof;
wherein the final component carrier is configured as a laminate-type component carrier.

6. The final component carrier according to claim 1, wherein the at least one exposed free end of the at least one electrically conductive connection structure is provided with at least one pad, the at least one pad being covered with a solder material.

7. A system, comprising:
a final component carrier, the final component carrier comprising:
- a laminated stack comprising at least two electrically insulating layer structures and at least one electrically conductive layer structure;
- a component having at least one electrically conductive connection structure and embedded in the laminated stack;
- wherein the component is embedded in two electrically insulating layer structures with the component extending into one of the two electrically insulating layer structures for a first distance and extending into a remaining one of the two electrically insulating layer structures for a second distance different than the first distance;
- wherein the at least one electrically conductive connection structure of the component is exposed with respect to the laminated stack so that a free exposed end of the at least one electrically conductive connection structure of the component flushes with or extends beyond an exterior main surface of the laminated stack;
- wherein an adhesive structure is arranged on a surface of the component facing away from the exposed electrically conductive connection structure; and
- at least one further component vertically stacked with the final component carrier and electrically coupled with the embedded component by the at least one electrically conductive connection structure of the component,
- wherein the at least one electrically conductive connection structure has a vertical electric connection to the at least one further component,
- wherein the at least one electrically conductive connection structure comprises at least one monolithic pillar,
- wherein the at least one monolithic pillar comprises a continuous sidewall that extends in a direction perpendicular to a main surface of the component from which the at least one monolithic pillar extends.

8. The system according to claim 7, further comprising one of the following features:
- the at least one further component is a non-embedded component being surface mounted on the final component carrier;
- the at least one further component is embedded in material of and forms part of a module being connected with the final component carrier.

* * * * *